United States Patent [19]

Shirai et al.

[11] Patent Number: 5,213,946
[45] Date of Patent: May 25, 1993

[54] POSITIVE TYPE, PHOTOSENSITIVE RESINOUS COMPOSITION

[75] Inventors: Masamitsu Shirai; Masahiro Tsunooka; Kanji Nishijima, all of Osaka; Katsukiyo Ishikawa, Kyoto, all of Japan

[73] Assignee: Nippon Paint Co., Ltd., Osaka, Japan

[21] Appl. No.: 716,977

[22] Filed: Jun. 18, 1991

[30] Foreign Application Priority Data

May 21, 1990 [JP] Japan .................................. 2-131641

[51] Int. Cl.$^5$ .............................................. G03F 7/039
[52] U.S. Cl. ..................................... 430/270; 430/905; 525/212; 526/287
[58] Field of Search ................ 430/270, 905; 525/212; 526/287

[56] References Cited

U.S. PATENT DOCUMENTS

| 4,491,628 | 1/1985 | Ito et al. ......................... 430/325 X |
| 4,736,055 | 4/1988 | Dietliker et al. ................... 526/287 |
| 4,869,995 | 9/1989 | Shirai et al. .......................... 430/270 |
| 4,883,740 | 11/1989 | Schwalm et al. ............... 430/905 X |

Primary Examiner—Cynthia Hamilton
Attorney, Agent, or Firm—Wenderoth, Lind & Ponack

[57] ABSTRACT

A novel positive type photosensitive resinous composition comprising a base resin having in at least one side chain or at an end portion of its main chain, an iminosulfonate group of the formula:

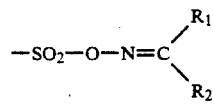

in which $R_1$ and $R_2$ are the same or different groups and each represents hydrogen atom, alkyl, acyl, phenyl, naphthyl, anthryl or benzyl group and $R_1$ and $R_2$, taken together with the carbon atom, may be an alicyclic ring, the composition further comprising a group containing an acid-decomposable bond, the content of said iminosulfonate group being $1 \times 10^{-5}$ to $3 \times 10^{-3}$ equivalent/g of the base resin. The present composition, when irradiated with radiation with 200 to 400 nm wavelength, can generate strong sulfonic acid groups, and is specifically useful as a photoresist for a circuit board, integrated circuit and the like.

4 Claims, No Drawings

POSITIVE TYPE, PHOTOSENSITIVE RESINOUS COMPOSITION

FIELD OF THE INVENTION

The present invention relates to a novel positive type, photosensitive resinous composition and more specifically, a novel positive type photosensitive resinous composition comprising base resins having in the side chain or at the end portion of the main chain, an iminosulfonate group which generates, upon photolysis, a strong acid and a group containing the bond which is decomposable at an elevated temperature in the presence of an acid (hereinafter called as acid-decomposable bond), and being useful a micro-processing photoresist to be used in the preparation of an integrated circuit, printed circuit board and the like or as a lithographic printing plate and the like.

BACKGROUND OF THE INVENTION

Since a positive type photosensitive resin which is convertible to a soluble form through photolysis with an active radiation such as ultraviolet ray and the like is, in general, far excellent in respect of resolving power to a negative type photosensitive resin, it is now widely used in the manufacture of integrated circuit, printed circuit board and the like as an etching resist.

Most popular positive type photosensitive resinous compositions comprise an alkali soluble novolak resin added with a quinone diazide compound.

However, such quinone diazide compound is comparatively unstable in heating and must be used in fairly large quantity so as to be effective as a solubilization inhibitor prior to photolysis step.

Furthermore, there are such problems as inferior flexibility of the formed resist film and poor adhesion properties thereof.

Furthermore, since the base material is a novolak resin, there is a drawback of excessive brittleness of the resist film prepared and adhesion between the base plate and the formed resist film is no good.

Quinone diazide will show a strong absorption at preferable wave lengths in an ultraviolet region, and therefore, a resinous composition containing such compound will hardly transmit active radiation in the ultraviolet region, resulting in comparatively poor photolysis especially at the interior.

To solve the abovementioned problems, the inventors have previously proposed a positive type photosensitive resinous composition containing iminosulfonate groups (Japanese Patent Publication (unexamined) No. 163736/89).

As an additional approach for obtaining far improved sensitivity and resolving power, a method has been proposed wherein a secondary decomposition is caused by utilizing an acidic material generated through a photolysis reaction, thereby solubilizing the resist resin (as in Japanese Patent Publication (unexamined) Nos. 45439/84 and ibid 250642/88).

In that method, as an acid source, use is made of an onium salt and thus produced acid is utilized in causing the successive reaction to produce a photo-soluble functional group.

For example, Japanese Patent Publication (unexamined) No. 45439/84 describes a resist composition comprising a polymer having acid-unstable branched groups, e.g. t-butyl ester of carboxylic acid and t-butyl carbonate of phenol, and an onium salt.

Japanese Patent Publication (unexamined) No. 250642/88 describes a radiation sensitive composition comprising a phenol novolak resin, an organic polymer having acid-unstable groups (e.g. polystyrene having t-butyl ester side group or t-butyl ether side group and the like), and an aryl onium salt.

However, in the former technique of using a resin having iminosulfonate groups, sulfonic acid groups are generated by photolysis reaction, which are then neutralized to solubilize the resin. Therefore, in that technique, the iminosulfonate group content should be at least $1.5 \times 10^{-4}$ equivalent/g or more, and however, since too much quantity may result in a large quantity of azine and ketone by-products and cause adverse effect on solubility of the resin, its upper limit should be confined to $2.5 \times 10^{-3}$ equivalent/g.

Thus, there are naturally limits on solubility of the resin and resolving power of the resist.

On the other hand, in the latter technique of using an onium salt, since the onium salt is hardly soluble in an organic solvent and deficient in compatibility with a resinous material, there is a limit on the resolving power of the resist made of the resinous composition with dispersed onium salt therein. Moreover, there are additional problems such that toxic or undesired metals as stibonium, antimonium and the like are co-present in the system and such resist is very expensive and unsuitable for commercial production.

It is, therefore, an object of the invention to provide a novel positive type photosensitive resinous composition based on a base resin containing iminosulfonate groups which can be decomposed through irradiation by radiations with 200 nm to 400 nm wavelengths and generate strong sulfonic acid groups, which is free from metal onium salt having adverse effects on device characteristics and having toxic properties, and characterized by having far desirable solubility properties and improved resolving power.

SUMMARY OF THE INVENTION

According to the invention, the abovementioned object can be successfully attained with a positive type photosensitive resinous composition comprising a base resin, having in at least one side chain or at an end portion of its main chain, an iminosulfonate group of the formula:

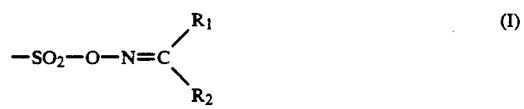

in which $R_1$ and $R_2$ are the same or different groups and each represents hydrogen atom, alkyl, acyl, phenyl, naphthyl, anthryl or benzyl group, and $R_1$ and $R_2$, taken together with the carbon atom may be an alicyclic ring, the composition further comprising a group containing an acid-decomposable bond, the content of said iminosulfonate group being $1 \times 10^{-5}$ to $3 \times 10^{-3}$ equivalent/g of the base resin.

The term "a group containing an acid-decomposable bond" as used herein shall denote, as herein under stated, a group which can be decomposed by the action of a strong acid of sulfonic acid under heating, to produce an alkali soluble group.

In this invention, at least one base resin is used and such base resin is carried in at least one side chain or at an end portion of the main chain, with an iminosulfonate group represented by the formula:

  (I)

in which $R_1$ and $R_2$ have the same meanings as defined above, and a group containing an acid-decomposable bond.

Therefore, the present resinous composition may be composed of one base resin in which both of the abovementioned iminosulfonate group and the group containing an acid-decomposable bond are carried, or a mixture of 2 or more base resins, one bearing the abovementioned iminosulfonate group and the other the group containing an acid-decomposable bond.

Any of the known resins for photosensitive resinous compositions, including acrylic resin, polyester resin and the like, may be successfully used in the present invention, and however, from the standpoint of production ease, improved adhesion toward substrate and the like, particular preference is given to acrylic resin. The invention shall be now more minutely explained with this particularly preferable acrylic resin.

Base Resin (1)

An acrylic resin having, in at least one side chain or at an end portion of the main chain, an iminosulfonate group of the formula:

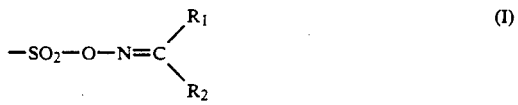  (I)

in which $R_1$ and $R_2$ are the same or different groups and each represents hydrogen atom, alkyl, acyl, phenyl, naphthyl, anthryl or benzyl group, or $R_1$ and $R_2$, taken together with the carbon atom, may be an alicyclic ring, may be easily prepared by the method stated in Japanese Patent Publication (unexamined) No. 163736/89.

That is, in the polymerization of $\alpha, \beta$-ethylenically unsaturated monomers, the undermentioned iminosulfonate group bearing monomer represented by the formula:

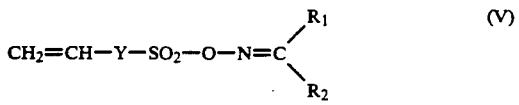  (V)

is used together with other copolymerizable mono-olefinic unsaturatd compounds.

The iminosulfonate group bearing monomer (V) may be advantageously prepared by reacting hydroxyl amine with a ketone of the formula: (II)

  (II)

($R_1$ and $R_2$ are as defined above), to obtain an oxime compound (III) of the formula:

  (III)

and reacting thus obtained oxime compound with a sulfonic halide having $\alpha,\beta$-ethylenically unsaturated bond represented by the formula:

$$CH_2=CH-Y-SO_2X \qquad (IV)$$

(in which X is halogen and Y is an organic group) in the presence of a base such as pyridine and the like.

In the case of polyester resin or other base resins, $\alpha, \beta$-ethylenically unsaturated groups are first incorporated into the resin according to know technique, and then the abovementioned iminosulfonate group bearing monomer is reacted by addition reaction, with the said resin.

Many of the sulfonic halides (IV) are commercially available in the market. Or they may be easily prepared by the reaction of potassium salt of a compound having both $\alpha,\beta$-ethylenically unsaturated bond and sulfonic group, e.g. allyl sulfonic acid, methallyl sulfonic acid, styrene sulfonic acid, vinyl sulfonic acid and 2-acrylamide-2-methyl propane sulfonic acid, with phosphor penta-chloride (see Journal of Polymer Science 21,781 (1985)).

As the oxime compounds (III), the following are known and advantageously used in the invention: 2-propanone oxime, acetoaldoxime, methylethylketoxime, 3-heptanone oxime, cyclohexanone oxime, 1,2-cyclohexane dione dioxime, biacetyl monooxime, acetophenone oxime, p-chloacetophenone oxim, p-nitroacetophenone oxime, o-nitroacetophenone oxime, p-methylacetophenone oxime, p-phenylacetophenone oxime, benzophenone oxime, methyl $\alpha$-naphthyl ketoxime, 9-anthracenyl benzyl ketoxime, tetralonoxime, fluorenone oxime and the like.

Instead of using the abovementioned iminosulfonate group bearing monomer, the present resin may be prepared by subjecting a resin having in its side chain or at an end portion of the main chain a sulfonic group to halogention and reacting thus obtained halogenated resin with an oxime compound of the formula (III).

Base Resin (2)

A base resin having a group containing an acid-decomposable bond, for example, acrylic resin, may be prepared, as stated in, for example, Japanese Patent Publication (unexamined) 45439/84, ibid 250642/88, by effecting homopolymerisation of such monomer having as an acid-decomposable bond t-butyl ester, t-butoxy or t-butoxy carbonyl oxy group, exemplified by t-butoxy styrene, t-butoxy carbonyloxy styrene, t-butyl ester group bearing styrene, t-butyl acrylate, t-butyl methacrylate and the like, or copolymerization of the abovementioned monomer with other copolymerizable monomers. Particularly preferable acid-decomposable bonds are t-butyl carbonate of phenol, t-butyl ether of phenol and t-butyl ester of carboxylic acid, and however, various other acid branched groups may be successfully used providing they result, through decomposition under heating in the presence of strong acid, in an alkali-soluble group. Thus, many branched groups modified with, for example, trityl, benzyl, benzhydryl groups may be likewise used.

The most preferable polymers are poly (p-t-butoxy carbonyloxy-α methylstyrene), poly (p-t-butoxy carbonyloxy styrene), poly (t-butyl-p-vinyl benzoate), poly (t-butyl-p-isopropenyl phenyloxy acetate), poly (t-butyl methacrylate), poly-t-butoxy styrene, poly-t-butoxy-α-methyl styrene and the like.

Base Resin (3)

In this invention, a base resin having both iminosulfonate group of the formula (I) and a group containing an acid-decomposable bond in the same molecule, in a side chain or at an end portion of the main chain may be satisfactorily used.

Such acrylic resin may be easily and advantageously prepared by copolymerizing an iminosulfonate group containing monomer represented by the formula (V), an acid-decomposable bond bearing monomer as above-mentioned and other optional copolymerizable monomers.

In this invention, either of the combination of above-mentioned resin (1) and resin (2), resin (3) alone, or the combination of resin (3) and resin (1) and/or resin (2) may be used as the base resin.

However, in either case, the content of the iminosulfonate group of the formula (I) should be in a range of $1 \times 10^{-5}$–$3 \times 10^{-3}$ equivalent/g, preferably $1 \times 10^{-5}$–$9 \times 10^{-4}$ equivalent/g.

When the present resin is photolyzed, iminosulfonate group is decomposed, liberating the characteristic group of

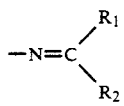

and producing a sulfonic acid group.

At the alkali developing step, the latter group makes the resin alkali-soluble.

Furthermore, in the present resin, since the light absorption maximum wave length may be freely selected in a range of about 200 to 400 nm depending on the kind of oxime used, the resin may be appropriately designed by selecting the oxime so as to be optimum to the selected light exposure device and very fine positive image may be obtained by utilizing active rays with short wave length.

In the invention of Japanese Patent Publication (unexamined) No. 163736/89, photolysis and solubilization of base resin were only relied on this iminosulfonate group and therefore, it was essential that the content of said iminosulfonate group should be at least $1.5 \times 10^{-4}$ equivalent/g or more. If the said content is less than the abovementioned lower limit, at the time when the photosensitive resin layer is exposed to radiation and treated with an alkali solution, there is a problem that it is hardly posible to obtain a sharp image because of the poor solubility of the photolyzed resin.

If the iminosulfonate group content is increased, the solubility of the resin is likewise increased, but at the same time, such by products as azine compound of the formula:

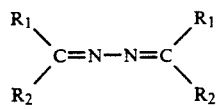

and ketone compound of the formula:

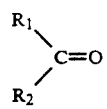

are naturally and proportionally increased and as a consequence, solubilization of the resin must be undesirably hindered. Therefore, in practice, the upper limit of the iminosulfonate group content was limited to at most $2.5 \times 10^{-3}$ equivalent/g whereas the present resinous composition includes a resin or resinous portion carrying with a group containing an acid-decomposable bond, t-butylcarbonate of phenol, t-butylether of phenol, t-butylester of carboxylic acid and the like, and this acid-decomposable bond is decomposed under heating and in the presence of strong acid, such as sulfonic acid which is generated at the time of photolysis, to give such group as carboxylic acid or phenol which may make the resin, at the time of alkali-development, soluble in the developer.

Therefore, coupled with the sulfonic acid groups produced by the decomposition of iminosulfonate group, the present base resin(s) is(are) far effectively solubilized. This means that iminosulfonate group content may be cut in a marked degree, as compared with that of the base resin of Japanese Patent Publication (unexamined) 163736/89, to obtain an effective solubilization of the base resin(s).

Even if the iminosulfonate group content is increased, solubilization-inhibiting effect of the abovementioned by-products is advantageously compensated with the action of alkali-solubilization group produced by the decomposition of acid-decomposable bond bearing group.

Thus, solubility of the resin is far improved and highly resolved, and a sharp image may be produced with the present composition.

In this sense, the iminosulfonate group content in the present base resin is selected in a range of $1 \times 10^{-5}$ to $9 \times 10^{-4}$ and most present photosensitive resinous compositions may be prepared by dissolving the base resin(s) in various solvents. Examples of the solvent are glycol ethers such as ethylene glycolmonoethyl ether, ethyleneglycol nonobutyl ether and the like; cellosolve esters such as ethyleneglycol monomethyl ether acetate, ethyleneglycol monoethyl ether acetate and the like; aromatic hydrocarbons such as toluene, xylene and the like; ketones such as methyl ethyl ketone, cyclohexanone and the like; esters such as ethylacetate, butylacetate and the like.

As a developer for the present photosensitive resinous composition, an aqueous solution of the following alkali may be satisfactorily used; inorganic alkali such as sodium metasilicate and the like; primary amines such as ethylamine, n-propylamine and the like; secondary amines such as diethanolamine, di-n-propylamine and the like; tertiary amines such as triethylamine, triethanolamine and the like; and quaternary ammonium salts such as tetramethylammonium hydroxide, tetraethylammonium hydroxide and the like.

The present resinous composition is excellent in flexibility and hence adhesion toward a substrate. Since the photosensitive group is incorporated into the resin, the resinous composition is excellent in storage stability. Moreover, absorption wavelength may be freely controlled in a range of 200-400 nm and high resolving power can be expected at a short wave length. Therefore, the composition may be advantageously used as a fine resist in the preparation of printed circuit board, integrated circuit and the like, and as a photosensitive material in a lithographic device. The invention shall be now more fully explained in the following examples. Unless otherwise, all parts and % are by weight.

SYNTHETIC EXAMPLE 1

Preparation Of Polymer Having Phenol t-Butylcarbonate Structure a) Into a 1 liter separable flask, were placed 100 parts of ethyleneglycol monobutylether and heated to 120° C. To this, was dropwise added a mixture of 100 parts of ethyleneglycol monobutylether, 32 parts of n-butyl acrylate, 154 parts of p-t-butoxycarbonyloxy styrene, 17 parts of tetraloneoxime p-styrene sulfonate and 5 parts of azobisisobutyronitrile in 5 hours and after elapsing 30 minutues, a mixture of 30 parts of ethyleneglycol monobutyl ether and 1 part of azobisisobutyronitrile in 30 minutes. Thereafter, the combined was reacted at the same temperature for 2 hours to obtain a varnish(A) of polymer having phenol t-butylcarbonate structure (solid content 46.2%). b) Into a 1 liter separable flask, were placed 100 parts of ethyleneglycol monobutylether and heated to 120° C. To this, was dropwise added a mixture of 100 parts of ethyleneglycol monobutylether,212 parts of p-t-butoxycarbonyl oxy styrene, 4 parts of azobisisobutyronitrile in 5 hours and after elapsing 30 minutues, a mixture of 30 parts of ethyleneglycol monobutyl ether and 1 part of azobisisobutyronitrile in 30 minutes. Thereafter the combined was reacted at the same temperature for 2 hours to obtain a varnish(B) of polymer having phenol t-butylcarbonate structure (solid content 47.4%).

SYNTHETIC EXAMPLE 2

Preparation Of Polymer Having Aromatic Carboxylic Acid t-Butyl Ester Structure a) Into a 1 liter separable flask, were placed 100 parts of ethyleneglycol monobutylether and heated to 110° C. To this, was dropwise added a mixture of 100 parts of ethyleneglycol monobutylether, 102 parts of t-butyl p-vinyl benzoate, 37 parts of fluorenoneoxime p-styrene sulfonate, 40 parts of methyl methacrylate and 5 parts of azobisisobutyronitrile in 7 hours and after elapsing 30 minutues, a mixture of 30 parts of ethyleneglycol monobutyl ether and 1 part of azobisisobutyronitrile in 30 minutes. Thereafter, the combined was reacted at the same temperature for 3 hours to obtain a varnish(C) of polymer having aromatic carboxylic acid t-butyl ester structure (solid content 43.1%).

b) Into a 1 liter separable flask, were placed 100 parts of ethyleneglycol monobutylether and heated to 120° C. To this, was dropwise added a mixture of 100 parts of ethyleneglycol monobutylether, 190 parts of t-butyl p-vinyl benzoate and 5 parts of azobisisobutyronitrile in 5 hours and after elapsing 30 minutues, a mixture of 30 parts of ethyleneglycol monobutyl ether and 1 part of azobisisobutyronitrile in 30 minutes. Thereafter, the combined was reacted at the same temperature for 2 hours to obtain a varnish(D) of polymer having aromatic carboxylic acid t-butylester structure (solid content 44.6%).

SYNTHETIC EXAMPLE 3

Preparation Of Polymer Having Aliphatic Carboxylic Acid t-Butyl Ester Structure Into a 1 liter separable flask, were placed 100 parts of ethyleneglycol monobutylether and heated to 110° C. To this, was dropwise added a mixture of 100 parts of ethyleneglycol monobutylether, 26 parts of methacrylic acid, 85 parts of t-butyl methacrylate,4 parts of fluorenoneoxime p-styrene sulfonate, 50 parts of methyl methacrylate and 5 parts of azobisisobutyronitrile in 7 hours and after elapsing 30 minutues, a mixture of 30 parts of ethyleneglycol monobutyl ether and 1 part of azobisisobutyronitrile in 30 minutes. Thereafter, the combined was reacted at the same temperature for 3 hours to obtain a varnish(E) of polymer having aliphaticcarboxylic acid t-butyl ester structure (solid content 41.1%).

SYNTHETIC EXAMPLE 4

Preparation Of Polymer Having Phenol T-butylether Structure

Into a 1 liter separable flask, were placed 100 parts of ethyleneglycol monobutylether and heated to 120° C. To this, was dropwise added a mixture of 100 parts of ethyleneglycol monobutylether, 70 parts of p-t-butoxy styrene, 7 parts of acetophenoneoxime 2-acrylamide-2-methylpropane sulfonate, 100 parts of n-butyl acrylate and 5 parts of azobisisobutyronitrile in 5 hours and after elapsing 30 minutues, a mixture of 30 parts of ethyleneglycol monobutyl ether and 1 part of azobisisobutyronitrile in 30 minutes. Thereafter, the combined was reacted at the same temperature for 2 hours to obtain a varnish(F) of polymer having phenol t-butylether structure (solid content 42.9%).

SYNTHETIC EXAMPLE 5

Preparation Of Polymer Having Iminosulfonate Group a) Into a 1 liter separable flask, were placed 100 parts of ethyleneglycol monobutyl ether and heated to 120° C.

To this, was added dropwise a mixture of 100 parts of ethyleneglycol monobutyl ether, 60 parts of n-butyl acrylate, 50 parts of fluorenoneoxime p-styrene sulfonate, 50 parts of methyl methacrylate and 8 parts of azobisisobutyronitrile in 4 hours and after elapsing 30 minutes, a mixture of 30 parts of ethyleneglycol monobutyl ether and 1 part of azobisisobutyronitrile in 30 minutes. The combined was further reacted at the same temperature for 1 hour to obtain a varnish (G) of polymer having iminosulfonate group (solid content 40.1%).

b) Into a 1 liter separable flask, were placed 100 parts of ethyleneglycol monobutyl ether and heated to 110° C. To this, was added dropwise a mixture of 100 parts of ethyleneglycol monobutyl ether, 10 parts of n-butyl acrylate, 200 parts of methylethyl ketoxime metharyl sulfonate, 10 parts of methyl methacrylate and 8 parts of azobisisobutyronitrile in 5 hours and after elapsing 30 minutes, a mixture of 30 parts of ethyleneglycol monobutyl ether and 1 part of azobisisobutyronitrile in 30 minutes. The combined was further reacted at the same temperature for 1 hour to obtain a varnish (H) of polymer having iminosulfonate group (solid content 47.9%).

EXAMPLE 1

50 Parts of polymer varnish (A) obtained in Synthetic Example 1(a) were dissolved in 100 parts of methylethyl ketone and thus obtained solution was filtered through 0.2 μm Miliporfilter to get a photosensitive liquid. This was applied on silicon oxide film wafer by using a spinner and dried in an oven at 100° C. for 15 minutes to obtain a photosensitive film of 1.2 m thickness.

Line-and space pattern was closely placed on the photosensitive film and the combined was irradiated by low pressure mercury lamp (light intensity at 254 nm: about 10mW/cm$^2$) for 50 seconds and then heated at 120° C. for 5 minutes. Thereafter, the film was developed with an aqueous 5% tetramethylammonium hydroxide solution at 30° C. for 60 seconds. Fine resist pattern was obtained and there was no cracks or defects of the resist.

A similar experiment was repeated by using the same photosensitive liquid but which had been stored 3 months, and exactly the same results were obtained.

EXAMPLE 2

50 Parts of polymer varnish (C) obtained in Synthetic Example 2(a) were dissolved in 100 parts of methylethyl ketone and thus obtained solution was filtered through 0.2 μm Miliporfilter to get a photosensitive liquid. This was applied on silicon oxide film wafer by using a spinner and dried in an oven at 100° C. for 15 minutes to obtain a photosensitive film of 1.3 μm thickness.

Line-and space pattern was closely placed on the photosensitive film and the combined was irradiated by high pressure mercury lamp (light intensity at 365 nm: about 5 mW/cm$^2$) for 60 seconds and then heated at 120° C. for 5 minutes. Thereafter, the film was developed with an aqueous 5% tetramethylammonium hydroxide solution at 30° C. for 80 seconds. Fine resist pattern was obtained and there was no cracks or defects of the resist.

A similar experiment was repeated by using the same photosensitive liquid bit which had been stored 3 months, and exactly the same results were obtained.

EXAMPLE 3

50 Parts of polymer varnish (F) obtained in Synthetic Example 4 were dissolved in 100 parts of methylethyl ketone and thus obtained solution was filtered through 0.2 μm Miliporfilter to get a photosensitive liquid. This was applied on silicon oxide film wafer by using a spinner and dried in an oven at 100° C. for 15 minutes to obtain a photosensitive film of 1.3 μm thickness.

Line-and space pattern was closely placed on the photosensitive film and the combined was irradiated by lowpressure mercury lamp (light intensity at 254 nm: about 10 mW/cm$^2$) for 60 seconds and then heated at 110° C. for 5 minutes. Thereafter, the film was developed with an aqueous 2% tetramethylammonium hydroxide solution at 25° C. for 60 seconds. Fine resist pattern was obtained and there was no cracks or defects of the resist.

A similar experiment was repeated by using the same photosensitive liquid but which had been stored 3 months, and exactly the same results were obtained.

EXAMPLE 4

25 Parts of polymer varnish (C) obtained in Synthetic Example 2(a) and 25 parts of polymer varnish (D) obtained in Synthetic Example 2(b) were dissolved in 100 parts of methylethyl ketone and thus obtained solution was filtered through 0.2 μm Miliporfilter to get a photosensitive liquid. This was applied on silicon oxide film wafer by using a spinner and dried in an oven at 100° C. for 15 minutes to obtain a photosensitive film of 1.3 μm thickness. Line-and space pattern was closely placed on the photosensitive film and the combined was irradiated by high pressure mercury lamp (light intensity at 365 nm: about 5 mW/cm$^2$) for 60 seconds and then heated at 120° C. for 5 minutes. Thereafter, the film was developed with an aqueous 5% tetramethylammonium hydroxide solution at 30° C. for 50 seconds. Fine resist pattern was obtained and there was no cracks or defects of the resist.

A similar experiment was repeated by using the same photosensitive liquid but which had been stored 3 months, and exactly the same results were obtained.

EXAMPLE 5

18 Parts of polymer varnish (A) obtained in Synthetic Example 1(a) and 32 parts of polymer varnish (H) obtained in Synthetic Example 5(b) were dissolved in 100 parts of methylethyl ketone and thus obtained solution was filtered through 0.2 μm Miliporfilter to get a photosensitive liquid. This was applied on silicon oxide film wafer by using a spinner and dried in an oven at 100° C. for 15 minutes to obtain a photosensitive film of 1.2 μm thickness. Line-and space pattern was closely placed on the photosensitive film and the combined was irradiated by low pressure mercury lamp (light intensity at 254 nm: about 10 mW/cm$^2$) for 100 seconds and then heated at 110° C. for 5 minutes. Thereafter, the film was developed with an aqueous 5% tetramethylammonium hydroxide solution at 30° C. for 50 seconds. Fine resist pattern was obtained and there was no cracks or defects of the resist.

A similar experiment was repeated by using the same photosensitive liquid bit which had been stored 3 months, and exactly the same results were obtained.

EXAMPLE 6

66 Parts of polymer varnish (B) obtained in Synthetic Example 1(b) and 1 parts of polymer varnish (G) obtained in Synthetic Example 5(a) were dissolved in 144 parts of methylethyl ketone and thus obtained solution was filtered through 0.2 μm Miliporfilter to get a photosensitive liquid. This was applied on silicon oxide film wafer by using a spinner and dried in an oven at 100° C. for 15 minutes to obtain a photosensitive film of 1.2 μm thickness. Line-and space pattern was closely placed on the photosensitive film and the combined was irradiated by high pressure mercury lamp (light intensity at 365 nm: about 5 mW/cm$^2$) for 50 seconds and then heated at 120° C. for 5 minutes. Thereafter, the film was developed with an aqueous 5% tetramethylammonium hydroxide solution at 30° C. for 60 seconds. Fine resist pattern was obtained and there was no cracks or defects of the resist.

A similar experiment was repeated by using the same photosensitive liquid bit which had been stored 3 months, and exactly the same results were obtained.

EXAMPLE 7

To 100 parts of polymer varnish (E) obtained in Synthetic Example 3, 6 parts of triethylamine were added and then 240 parts of deionized water were gradually added while keep stirring to obtain an eloectrodeposition bath liquid. Copper plated print base plate having through holes was then dipped into the electrodeposition bath liquid and after connecting the base plate to anode and using a separate cathode, 150 V direct current was applied for 3 minutes to deposit a photosensitive resinous film (about 8 μm thickness) on the base plate, which was then washed with water and dried at 100° C. for 7 minutes. On thus obtained photosensitive resinous layer, a positive type phototool having a circuit pattern was closely placed and the composite was exposed through both sides to a high pressure mercury lamp (365 nm light intensity: about 5 mW/cm$^2$) for 60 seconds. After heating at 120° C. for 5 minutes, the photosensitive resinous layer was developed by using an aqueous 1% sodium carbonate solution at 30° C. for 80 seconds. Fine resist pattern was obtained and no cracks and defects of the resist were observed.

Similar experiments were repeated by using the same electrodeposition bath but which had been stored 3 months, and exactly the same results were obtained.

What is claimed is:

1. A positive type photosensitive resinous composition comprising a base resin, having in at least one side chain or at an end portion of its main chain, an iminosulfonate group of the formula:

in which $R_1$ and $R_2$ are the same or different groups, and each represents hydrogen, alkyl, acyl, phenyl, naphthyl, anthryl or benzyl, or $R_1$ or $R_2$, taken together with the carbon atom, may be an alicyclic ring, said base resin further having a group containing an acid-decomposable bond, the content of said iminosulfonate group being $1 \times 10^{-5}$ to $3 \times 10^{-3}$ equivalent of said iminosulfonate group per gram of base resin.

2. The resinous composition according to claim 2, wherein the group containing an acid-decomposable bond is t-butyl carbonate of phenol.

3. The resinous composition according to claim 1, wherein the group containing an acid-decomposable bond is t-butyl ether of phenol.

4. The resinous composition according to claim 1, wherein the group containing an acid-decomposable bond is t-butyl ester of a carboxylic acid.

* * * * *